METHOD OF MAKING A HETEROJUNCTION SEMICONDUCTOR DEVICE

Filed June 3, 1964

INVENTOR.
JOHN S. BROWNSON
BY Melvin R. Jenney,
Richard L. Hildreth
&
Robert J. Horn, Jr.

3,338,760

METHOD OF MAKING A HETEROJUNCTION SEMICONDUCTOR DEVICE

John S. Brownson, Watertown, Mass., assignor to Massachusetts Institute of Technology, Cambridge, Mass., a corporation of Massachusetts Filed June 3, 1964, Ser. No. 372,308
5 Claims. (Cl. 148—175)

This invention relates to heterojunction semiconductor devices, with particular but not exclusive application to high speed switching diodes.

A heterojunction diode is a semiconductor device which is characterized by a junction between two zones of dissimilar semiconductor materials. Heterojunction devices are known to the art and are to be distinguished from devices which employ a homogeneous junction between zones of the same semiconductor meaterial. Heterojunction diodes employing semiconductor materials of the same conductivity type, that is, n-n or p-p types, have heretofore not been commercially practical because of their poor reverse-current blocking characteristics which rendered them unsatisfactory for normal circuit applications. Previous attempts to overcome this limitation have involved the use of a semiconductor material having relatively high resistivity. This results in reducing the reverse current, but at a marked sacrifice in the forward conduction capability due to the substantial series resistance resulting from the high resistivity base material.

To enable heterojunction devices to find effective application in high speed circuitry where appreciable current-carrying capacity is also a requirement, the present invention has as an object the provision of heterojunction semiconductor devices distinguished by high forward current-carrying capacity and low reverse current, while retaining the high speed capabilities that are characteristic of n-n or p-p heterojunction devices generally.

As will appear more fully in the description which follows, it has been found possible to retain the desirable high speed performance while achieving a marked improvement in forward and reverse current characteristics through the employment of a multi-layer substrate in which the layers have dissimilar characteristics. The invention further involves a procedure by which high-performance heterojunction devices may be manufactured embodying a multi-layer substrate.

The several features of the invention will be apparent form the detailed description and the accompanying drawings in which.

Heterojunction semiconductor devices incorporate a junction zone between a substrate and deposition layer of dissimilar semiconductor materials. In prior heterojunction semiconductor devices the base, or substrate, has been constructed of a layer of one material. When a relatively high resistivity material is used, the reverse current blocking characteristics are reasonably satisfactory. However, in these devices the series resistance caused by the large resistance of the base or substrate, apart from the resistance of the junction, is undesirably large and serves to limit substantially the forward current-carrying capability.

On the other hand, when prior devices use relatively low resistivity material in the base to permit appreciable forward current flow without excessive voltage drop, the heterojunction devices exhibit inherently poor reverse blocking characteristics due to this low resistivity material.

The teachings of the present invention permit the simultaneous achievement of fast switching speed and the proper reverse blocking characteristics necessary for efficient operation. The present invention involves the use of two materials of quite different characteristics for the base portion. High resistivity material is used for a zone contiguous to the heterojunction and low resistivity material for a zone adjacent to the base terminal.

The zone of high resistivity contiguous to the heterojunction is of a thickness sufficient to accommodate the heterojunction depletion layer. The depletion layer, in which free charge does not exist, extends into the zone of high resistivity material to a depth which is dependent upon the total junction bias voltage and the resistivity of the material in which it is situated. The zone of high resistivity material, therefore, should be of sufficient width so that the depletion layer does not penetrate completely through it within the range of voltages employed in the application. A reduction in the thickness of the high resistivity layer will normally result in a faster switching time. However, the thickness of the layer should not be reduced to the point where the germanium tends to alloy completely through the high resistivity layer or otherwise degrades reverse blocking characteristics.

Another property of n-n and p-p heterojunction diodes, which is important from an applications consideration, is that they will tolerate total radiation levels which would irreversibly destroy rectifying properties of conventional p-n diodes. Heretofore, n-n and p-p heterojunction diodes have been unsuitable for a high radiation environment application because of their unsatisfactory reverse blocking characteristics. The improvements resulting from this invention make possible rectifiers whose reverse blocking characteristics are acceptable in many situations and thus could be used in practical applications in high radiation environments.

Figure 1:
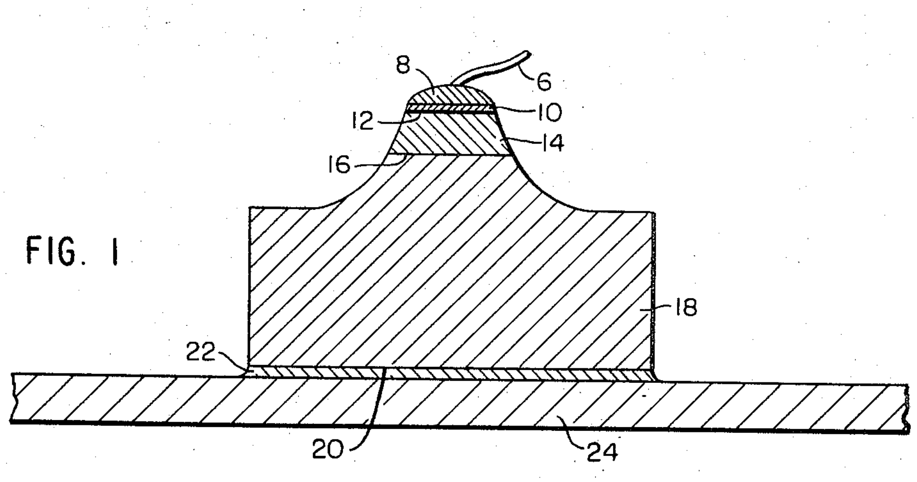
FIG. 1 is a schematic representation on a substantially enlarged scale of a heterojunction diode according to the invention.

Referring now to FIG. 1, the structure of a heterojunction semiconductor in the form of a diode according to the present invention is shown in cross-section. A zone of germanium-silicon alloy 10 is shown separated by a heterojunction 12 from a zone of high resistivity silicon. A zone of low resistivity silicon 18 is joined to the high resistivity silicon 14 at boundary 16. Solder layers 8 and 22 connect the diode to an ohmic contact 6 and a header terminal 24 in a typical application.

In a preferred embodiment of the invention, a relatively thin layer 14 contiguous to the heterojunction is of high resistivity, while the remainder 18 of the substrate is of low resistivity, thus reducing the bulk parasitic series resistance to a minimum. Referring to FIG. 1, a typical example of a semiconductor in the form of a diode according to the invention, the germanium-silicon zone 10 has a thickness of 0.75$\mu$ and a resistivity of 0.02 ohm-centimeters. Silicon zone 14 has a thickness of 35$\mu$ and a resistivity of 20 ohm-centimeters. Silicon zone 18 has a thickness of 250$\mu$ and a resistivity of 0.002 ohm-centimeters. It should be noted that although FIG. 1 shows a mesa type structure the invention should not be so limited as other semiconductor configurations employing a two-layered substrate heterojunction are contemplated as well.

The three-layered semiconductor portion of the heterojunction diode is formed in two distinct steps. The lightly doped high resistivity silicon layer is epitaxally grown on the surface of the more heavily doped low resistivity silicon substrate by means of a conventional procedure known as the Theuerer open tube process. According to this procedure, the low resistivity silicon substrate is heated to 1200° C. in a furnace filled with hydrogen gas. Hydrogen containing approximately one percent silicon tetrachloride vapor is introduced into the furnace, the halide acting as a transport mechanism. When the silicon tetrachloride vapor strikes the hot silicon substrate the following reaction takes place.

$$SiCl_4+2H_2 \text{ at } 1200° \text{ C.} \rightarrow Si+4HCl$$

The silicon deposits on the surface of the silicon substrate to form a single epitaxial crystal. The deposition is continued until a layer of the desired thickness has been deposited on the low resistivity substrate.

With the two-layered silicon base thus formed, the next step in the process is the formation of the heterojunction on the high resistivity layer of the silicon base. To this end the silicon substrate is kept at 1100° C. in an open tube furnace. At this temperature the silicon is self-reducing so no oxide film is formed on its surface. A hydrogen atmosphere is maintained in the furnace to lessen the opportunity for oxide formation and to subsequently reduce the semiconductor halide. Hydrogen containing approximately one percent of heavily doped germanium tetrachloride vapor is then introduced into the furnace and the germanium halide upon coming into contact with the hot surface of the silicon and in the presence of hydrogen gas undergoes the following reduction:

$$GeCl_4+2H_2 \rightarrow Ge+4HCl$$

The germanium is thus deposited on the surface of the silicon. It should be noted that this is but one of several deposition techniques and diffusion processes which may be employed to form the heterojunction. Halides other than chlorine may be used as transport media. Both closed and open tube processes may be employed to accomplish the same result as well as a disproportionation reaction method as follows:

$$GeCl_4 \rightarrow Ge+2Cl_2$$

The novel deposition technique of this invention, unlike those processes heretofore used in the art, involves the maintenance of the substrate at a higher temperature than the deposit material during deposition. The silicon substrate is kept at 1100° C. which is higher than the melting point of germanium during the deposition. Thus, the germanium, upon contacting the hot silicon, melts and forms a thin liquid film on the surface of the substrate. This liquid germanium dissolves some of the silicon substrate on which it has been deposited and there results an alloy of germanium and silicon.

After deposition of the germanium is initiated at the higher temperatures, the furnace temperature is gradually dropped to about 970° C. and growth is continued until until a total of about $0.7\mu$ of germanium has been deposited. The concentration of germanium halide in the hydrogen is then reduced to zero and the germanium-silicon solution is allowed to freeze out and regrow on the silicon substrate. This alloy of germanium-silicon is about 75% germanium and 25% silicon.

After the heterojunction is formed on the silicon substrate the diodes are fabricated and ohmic contacts are applied in a conventional manner. The crystals which were formed in the process heretofore described are reduced in size to the desired dimensions and the diode junction edge surfaces are etched and cleaned. The top and bottom surfaces of the diode crystal are nickel plated and ohmic contacts are soldered on the plated surfaces.

Figure 2:
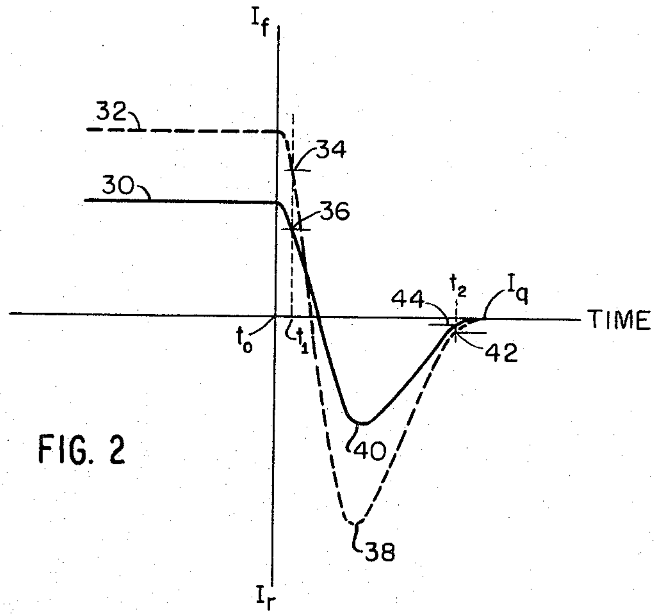
FIG. 2 is a typical plot showing switching time at two different current levels through the diode.

Reference is made to FIG. 2 which indicates that the turn-off of the diode is independent of the forward current flowing through the diode for a given reverse voltage. If solid line 30 and dotted line 32 indicate levels of forward current ($I_f$) of 5 ma. and 10 ma. respectively and the switch is turned off at time $t_0$ by reversing the voltage applied thereto, it can be seen that the current levels drop until they reach maximum levels of reverse current ($I_r$) at points 38 and 40 before returning to a quiescent level at $I_q$. The turn-off time is measured as the time interval between a point on the curve representing 10% of the absolute current change from $I_f$ to $I_r$ max. as indicated by points 34 and 36 corresponding to $t_1$, and a point on the curve where the current has returned 90% of the distance from $I_r$ max. to $I_q$ as indicated by points 42 and 44 corresponding to $t_2$. The turn-off time for the diode is equal to $t_2-t_1$ which is equal to 1.75 nanoseconds.

FIG. 2 refers to a low-current capacity diode with a maximum forward current of 10 ma. in a circuit with an external load resistance of 75 ohms. High current capacity diodes according to this invention have been built with a maximum forward current capacity of 300 ma. The turn-off time for these diodes is $8\pm1$ nanoseconds in a circuit with an external load resistance of 75 ohms.

In low power circuitry these diodes switch comparably fast and perhaps somewhat faster than their best available commercial counterparts. In medium power applications, however, involving currents of 100–300 ma., the diode described has a switching time 5–10 times faster than its commercial equivalent. It can be seen that the invention has its greatest potential in medium to high power applications.

The specific example of this invention as described herein has been that of a germanium-silicon diode. It must be understood, however, that the invention contemplates the use of combinations of materials other than silicon and germanium in the manufacture of heterojunction semiconductor devices. For example, gallium phosphide, gallium arsenide, indium antimonide, gallium antimonide, indium arsenide, and indium phosphide among other commonly used substances, including germanium and silicon, should be comparably effective in a diode structure based on this invention. Similarly, while the invention as described refers to an n-n type heterojunction, a p-p type heterojunction would operate in an essentially identical manner, except for a reversal of the polarities shown. The doping of these materials is done according to standard procedures well known to those in the semiconductor field. In the silicon-germanium diode described above the silicon is lightly doped compared with the germanium. It is to be noted, however, that an electronic barrier exists in the heterojunction diode independently of doping. An electronic barrier will exist provided the energy band gap or electron affinity of the two substances are different.

The heterojunction diodes described herein have particular application in logic circuitry and other types of switching applications where switching speed is of paramount importance. These diodes may be utilized in both small signal devices and in applications requiring a large surface area for substantial current carrying capability. Particularly in large current applications, heterojunction semiconductor devices according to this invention offer substantial advantages over prior devices.

It is to be understood that the specific embodiments of the invention shown and described are but illustrative and that various modifications may be made therein without departing from the scope and spirit of this invenion.

What is claimed is:

1. In the process of preparing a semiconductor heterojunction which includes the steps of depositing on a semiconductor substrate material a dissimilar semiconductor deposit material of the same conductivity type and of lower melting point than said substrate material, the improvement which comprises maintaining the substrate material in a vessel in an atmosphere of a mixture of hydrogen and halide of said deposit material at a temperature in the range between the melting point of said deposit material and the melting point of said substrate material causing said deposit material to contact said substrate material and melt thereon, and lowering the temperature in the vessel to solidify said deposit material on said substrate material.

2. In the process of preparing a germanium-silicon heterojunction which includes the steps of depositing germanium on a silicon substrate, said germanium and silicon being of the same conductivity type, the improvement which comprises maintaining a silicon substrate in a vessel at a temperature in the range from 1000° C. to 1400° C., causing a gaseous mixture of hydrogen and a halide of germanium to contact the silicon substrate and said germanium to melt thereon, and lowering the temperature in the vessel to solidify the germanium on the surface of the silicon substrate.

3. In the process of preparing a germanium-silicon heterojunction diode which includes the steps of depositing germanium on a silicon substrate said germanium and silicon being of the same conductivity type, said silicon substrate comprising a first zone of low resistivity and a second zone of high resistivity, said germanium being deposited on said second zone of said silicon substrate, the improvement which comprises maintaining said silicon substrate in a vessel at a temperature in the range from 1000° C. to 1400° C., causing a gaseous mixture of hydrogen and halide of germanium to contact said substrate so as to melt the germanium on the silicon substrate, and lowering the temperature in the vessel to solidify the germanium on the surface of the silicon substrate.

4. In a process for preparing a semiconductor heterojunction which includes the steps of depositing on a semiconductor substrate material a dissimilar semiconductor deposit material of the same conductivity type as said substrate material and of lower melting point than said substrate material, the improvement which comprises maintaining the substrate in a vessel at a temperature below the melting point of said substrate material in an atmosphere of a mixture of hydrogen and a halide of said substrate material, whereby said substrate material from said halide is deposited upon said substrate material to form a single epitaxial crystal therewith, maintaining said substrate and epitaxial layer in a vessel in an atmosphere of a mixture of hydrogen and a halide of said deposit material at a temperature in the range between the melting point of said deposit material and a melting point of said substrate material causing said deposit material to contact said substrate material and melt thereon, and lowering the temperature in the vessel to solidify said deposit material on said substrate material.

5. In the process for preparing a germanium-silicon heterojunction diode which includes the steps of depositing germanium on a relatively high resistivity zone of a substrate of silicon, said germanium and silicon being of the same conductivity type, the improvement which comprises maintaining a relatively low resistivity substrate of silicon in a vessel in an atmosphere comprised of a mixture of hydrogen and a halide of silicon at a temperature below the melting temperature of silicon, said silicon from said halide forming an epitaxial layer upon said relatively low resistivity silicon substrate, said epitaxial layer being of relatively high resistivity, maintaining said silicon subtrate and epitaxial layer in a vessel at a temperature in a range from 1000° C. to 1400° C., causing a gaseous mixture of hydrogen and a halide of germanium to contact said epitaxial layer to form a melt on germanium on said epitaxial layer, and lowering the temperature in the vessel to solidify the germanium on said epitaxial silicon layer.

References Cited

UNITED STATES PATENTS

| | | | |
|---|---|---|---|
| 2,790,940 | 4/1957 | Prince | 317—234 |
| 2,802,759 | 8/1957 | Moles | 148—175 |
| 2,880,117 | 3/1959 | Hanlet | 148—175 |
| 2,930,722 | 3/1960 | Ligenza. | |
| 3,028,529 | 4/1962 | Belmont et al. | 317—234 |
| 3,057,762 | 10/1962 | Gans | 148—171 |
| 3,102,828 | 9/1963 | Courvoisier. | |
| 3,170,825 | 2/1965 | Schaarschmidt. | |
| 3,192,081 | 6/1965 | Cocca. | |
| 3,200,018 | 8/1965 | Grossman | 148—174 |
| 3,211,970 | 10/1965 | Christian | 317—234 X |

DAVID L. RECK, *Primary Examiner.*

JOHN W. HUCKERT, A. M. LESNIAK, N. F. MARKVA, *Assistant Examiners.*